United States Patent [19]

Basi et al.

[11] Patent Number: 4,549,374
[45] Date of Patent: Oct. 29, 1985

[54] METHOD FOR POLISHING SEMICONDUCTOR WAFERS WITH MONTMORILLONITE SLURRY

[75] Inventors: Jagtar S. Basi, Fishkill; Eric Mandel, Poughkeepsie, both of N.Y.

[73] Assignee: International Business Machines Corporation, Armonk, N.Y.

[21] Appl. No.: 690,917

[22] Filed: Jan. 14, 1985

Related U.S. Application Data

[63] Continuation of Ser. No. 407,403, Aug. 12, 1982, abandoned.

[51] Int. Cl.$^4$ ............................................. B24B 1/00
[52] U.S. Cl. .................................. 51/283 R; 51/308; 106/3

[58] Field of Search ................ 51/283 R, 281 R, 308, 51/307; 106/3

[56] References Cited

U.S. PATENT DOCUMENTS

| | | | |
|---|---|---|---|
| 3,420,681 | 1/1969 | Karrip | 51/308 |
| 3,715,842 | 2/1973 | Tredinnick et al. | 51/308 |
| 3,922,393 | 11/1975 | Sears, Jr. | 51/281 R |
| 4,226,623 | 10/1980 | Koshiyama et al. | 51/308 |

Primary Examiner—Frederick R. Schmidt
Assistant Examiner—Robert A. Rose
Attorney, Agent, or Firm—T. Rao Coca

[57] ABSTRACT

Semiconductor wafers are polished with an abrasive slurry which is prepared by dispersing montmorillonite clay in deionized water. The pH of the slurry is adjusted to 9.5 to 12.5 by adding alkali such as NaOH and KOH.

6 Claims, No Drawings

4,549,374

METHOD FOR POLISHING SEMICONDUCTOR WAFERS WITH MONTMORILLONITE SLURRY

CROSS REFERENCES TO RELATED APPLICATION

This application is a continuation of U.S. application Ser. No. 407,403, filed on Aug. 12, 1982, now abandoned.

TECHNICAL FIELD

This invention relates to the polishing of the surfaces of semiconductor wafers. In the production of semiconductor devices, polished silicon wafers free of undesirable crystal detects and surface imperfections are a basic requirement. In a typical process for fabricating semiconductor devices, the surfaces of the wafers are polished and cleaned at the last step in the process of preparing the wafers.

BACKGROUND ART

In the prior art, semiconductor wafers, particularly silicon wafers, have been polished by silica based slurries using many different types of polishing machines. Although a number of improvements have been made to the silica based slurry, there has been no substitute to colloidal silicon dioxide for achieving an acceptable degree of perfection.

A typical abrasive slurry for polishing silicon wafers is taught in J. S. Basi U.S. Pat. No. 4,057,939 assigned to the same assignee as this invention. The slurry comprises colloidal $SiO_2$ mixed with $NaCO_3$ and an oxidizing agent such as sodium dichloroisocyanurate. It is believed that the polishing mechanism is due to the rapid oxidation of silicon to $SiO_2$ by the polishing slurry component, followed by softening of $SiO_2$ thus formed to give silica gel ($Si(OH)_4$) which, in turn, further absorbs the slurry components and becomes softer and is easily removed by the scrubbing action of the polishing slurry. Thus, the polishing mechanism is chemical-mechanical.

Polishing may be effected in machines such as described in Goetz et al. U.S. Pat. No. 3,691,694 including modifications thereof in accordance with the planetary configuration shown in *IBM Technical Disclosure Bulletin*, pp. 1760–1761, Vol. 15, No. 6, November 1972.

It is also known that montmorillonite minerals have been mined in a large volume and have been used as a binder for sand foundry molds and as a thickener for oil-well drilling muds. "The Colloid Chemistry of Silica and Silicates" by R. G. Iler, pp. 190–199, Cornell University Press, 1955 describes the chemical structure and nature of montmorillonite minerals.

G. G. Rayner, U.S. Pat. No. 3,966,432 entitled "Liquid Abrasive Compositions Containing A Silicate Suspending Agent" teaches that natural and synthetic clays including hydrophobically treated montmorillonite can be used as a suspending agent for abrasive material for cleaning hard surfaces of such materials as stainless steel, ceramics and vitreous enamel. The abrasive materials listed are calcite (ground marble), silica, felspar, pumice, hieselguhr and labradorite.

C. W. Dahlin, U.S. Pat. No. 4,169,796 teaches that sodium montmorillonite clay when it is mixed with dicalcium phosphate and distilled demineralized water creates an effective and useful shaving lotion and a product for polishing and cleaning dentures.

Nonetheless, there has been no attempt in the known prior art to utilize montmorillonite clay in the manufacture of semiconductor devices, particularly for polishing semiconductor wafers.

DISCLOSURE OF INVENTION

It is an object of the present invention to provide a new slurry composition for polishing semiconductor wafers.

It is another object of the invention to provide a substitute for silica based slurries.

It is a further object of the invention to provide a polishing agent for semiconductor wafers which does not degrade polishing pads.

It is still another object of the invention to provide a relatively inexpensive polishing slurry for semiconductor wafers.

There are two approaches that are generally used to polish silicon wafers. The first approach involves a two step process. Step one of the two-step process entails the use of high applied pressure to the workpiece for rapid stock removal. Step two is done at low pressures for a short time and is done primarily for cosmetic purposes, though in some instances, it may also be used to remove superficial surface damage.

The second approach is a single step process performed at low pressure and longer times. This approach can be applied to a single side or simultaneous two-sided free polishing.

Low applied pressure generally means that the applied load on the workpiece is less than 10 psi. High pressure polishing means using an applied load in excess of 10 psi and as high as 80 psi. The slurry of the present invention can be used in all variations of polishing, with different types of high and low pressure polishing machines and with all types of polishing pads.

In accordance with the present invention, the polishing slurry comprises montmorillonite, deionized water and an alkali such as sodium hydroxide or potassium hydroxide. The polishing slurry is prepared by slowly adding two to ten percent by weight of montmorillonite powder to deionized water with continuous stirring to form a colloidal suspension. The pH of the suspension is then adjusted to the value in the range of 9.5–12.5 by monitored addition of sodium or potassium hydroxide solution.

In the polishing operation, NaOH or KOH reacts with silicon to form $Na_4SiO_4$ or $K_4SiO_4$ which is mechanically removed by montmorillonite. With the value of pH higher than 12.5, the silicon surface tends to be excessively etched, which makes it difficult to achieve smooth and flat surface. When pH is lower than 9.5, effective polishing is hard to achieve because of the low level of chemical reaction.

Since an oxidizing agent such as NaOCl need not be included in the polishing slurry of the invention, the problem of oxidizing agent induced pad degradation is eliminated. The present invention provides a second source for semiconductor polishing slurry, which is much less expensive than the conventional silica based slurry.

BEST MODE FOR CARRYING OUT THE INVENTION

Montmorillonite clay which is available under the trade name of GELWHITE (Trademark) from George Kaolin Co., is added slowly to deionized water to form a colloidal suspension. The pH of the suspension is adjusted to the value of 11.5 for low pressure polishing and to 12.0 for high pressure polishing. Silicon wafers having a diameter of 82.5 mm are polished with the slurry utilizing a free polisher which is substantially described in the aforementioned Goetz U.S. Pat. No. 3,691,694.

The free polisher comprises a rotatable platen having a polishing cloth on the upper surface upon which a mask having suitable apertures therein for receiving wafers is positioned. A hoop is connected to the mask for imparting rotation thereof separately from the rotation of the platen. Overlying the mask and wafers is an upper plate having a polishing cloth thereon for applying a uniform pressure upon the opposite surface of the wafer. The upper plate is separately driven so that upon rotation of the platen, hoop and the mask, and the upper plate the opposite planar surfaces of the wafer is brought into coplanarity while being polished.

In polishing operation, a polishing slurry is provided on the polishing cloth at the central portion of the platen by a feed system. As the upper plate turns within the hoop, radially extending grooves in the plate catch excess slurry and due to the centrifugal force caused by rotation of the plate to move the slurry outwardly. In this manner excess polishing slurry is removed from the platen and caught in a suitable container for reprocessing and reuse if desired. During polishing, wheel speeds may vary from 40 rpm to 60 rpm, optimum at 55 rpm.

Tables I and II show the conditions used in low pressure polishing and high pressure polishing respectively.

TABLE

| Pressure (psi) | pH | Slurry Flow Rate (cc/min.) | Temp. (°C.) | Removal Rate (μm/min.) |
|---|---|---|---|---|
| 2.6 | 11.5 | 500 | 54 | 0.8 |
| 4.5 | 11.5 | 500 | 42 | 0.5 |
| 5.3 | 11.5 | 500 | 42 | 0.8 |

TABLE

| Pressure (psi) | pH | Slurry Flow Rate (cc/min.) | Temp. (°C.) | Removal Rate (μm/min.) |
|---|---|---|---|---|
| 37 | 12.0 | 300 | 40–90 | 5.1 |
| 80 | 12.0 | 300 | 40–90 | 8.5 |

The stock removal rates accomplished with this slurry are comparable to the removal rates achieved with the silica based slurry which includes an oxidizing agent such as NaOCl, as disclosed in the aforementioned U.S. Pat. No. 4,057,939. Such oxidizing agent is known to degrade the polishing cloth. Typically the life of the polishing cloth is reduced to one-half when it is subjected to an oxidizing agent.

The slurry flow rate can be any rate in the range of 300 to 500 cc/min. When it is lower than 300 cc/min., the friction between the polishing cloth and the wafers becomes excessive and renders it difficult to run the polisher. The flow rate larger than 500 cc/min. is simply not necessary and it is wasteful.

In the high pressure polishing, the polishing temperature is determined by the friction between the polishing cloth and the wafers, and it can vary from 40° to 90° C.

The mechanism of stock removal is more mechanical in the high pressure polishing so that the applied pressure is the predominent factor for controlling stock removal rates. It should be noted that with low pressure polishing, stock removal rates typically are most sensitive to pressure and temperature variations.

After polishing and removal from the polishing ambient, the wafer surfaces are readily cleanable. One singular effect is that the addition of NaOCl (sodium hypochlorite) at an appropriate time near the end of the polishing cycle results in a hydrophillic surface after polishing. This ability to render surfaces hydrophillic, characteristic of hypohallites, facilitates post polish wafer cleaning. Although an 82.5 mm wafer was used to demonstrate the invention, any size wafer can be polished with the polishing slurry of the invention.

While this invention has been particularly described with reference to the preferred embodiments thereof, it will be understood by those skilled in the art that the foregoing and other changes in form and details may be made therein without departing from the spirit and scope of the invention.

What is claimed is:

1. A method for polising the surface of a semiconductor wafer to render said surface smooth and flat, said method comprising:
   polishing the wafer surface with a surfactant-free slurry consisting primarily of powdered montmorillonite mineral colloidally suspended in deionized water and an alkaline solution in an amount sufficient to adjust the pH value of said suspension to be in the range of 9.5 to 12.5.

2. The method of claim 1 wherein the weight percent of montmorillonite powder is about 2 to 10 of said suspension.

3. A colloidal liquid composition free of surfactants and oxidizing agents and specifically suitable for relatively inexpensive polishing of semiconductor substrates said composition consisting of a mixture of about 2 to 10 percent by weight of montmorillonite clay deionized water, and an alkali compound of sodium hydroxide in an amount sufficient to render the pH value of said mixture in the range of 9.5 to 12.5.

4. The composition as recited in claim 3 wherein said alkaline compound is potassium hydroxide.

5. A method of polishing a silicon semiconductor wafer surface comprising:
   (a) applying to said silicon wafer surface by means of a polishing pad a polishing slurry consisting of 2–10 percent by weight of colloidal montmorillonite mineral admixed with deionized water and the alkaline compound of NaOH, said alkaline compound being in an amount sufficient to adjust the pH value of the slurry to be in the range of 9.5–12.5, to cause a chemical reaction of said NaOH with said silicon surface and form thereon the alkaline metal silicate of $Na_4SiO_4$; and
   (b) mechanically removing said $Na_4SiO_4$ from said surface with said montmorillonite by rubbing said surface with said pad,
   whereby said silicon wafer surface is rendered free of undesirable crystal defects and surface imperfections while causing minimal degradation of said polishing pad.

6. The method as recited in claim 5 wherein said alkaline compound is KOH and said silicate is $K_4SiO_4$.

* * * * *

UNITED STATES PATENT AND TRADEMARK OFFICE
CERTIFICATE OF CORRECTION

PATENT NO.  : 4,549,374
DATED       : October 29, 1985
INVENTOR(S) : JAGTAR S. BASI and ERIC MENDEL It is certified that error appears in the above-identified patent and that said Letters Patent is hereby corrected as shown below:

In the heading, "Mandel" should be --Mendel--.

Signed and Sealed this

Eighteenth Day of February 1986

[SEAL]

Attest:

DONALD J. QUIGG

Attesting Officer

Commissioner of Patents and Trademarks